(12) United States Patent
Ohta et al.

(10) Patent No.: US 8,149,547 B2
(45) Date of Patent: Apr. 3, 2012

(54) MAGNETORESISTIVE EFFECT ELEMENT AND THIN-FILM MAGNETIC HEAD WITH THE MAGNETORESISTIVE EFFECT ELEMENT

(75) Inventors: Naoki Ohta, Tokyo (JP); Satoshi Miura, Tokyo (JP); Tomohito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 928 days.

(21) Appl. No.: 12/047,722

(22) Filed: Mar. 13, 2008

(65) Prior Publication Data

US 2009/0231762 A1 Sep. 17, 2009

(51) Int. Cl.
*G11B 5/33* (2006.01)
*G11B 5/127* (2006.01)
(52) U.S. Cl. .................................. 360/324.12
(58) Field of Classification Search ............... 360/324.1, 360/324.11, 324.12
See application file for complete search history.

(56) References Cited

U.S. PATENT DOCUMENTS

| | | | |
|---|---|---|---|
| 2001/0012188 A1* | 8/2001 | Hasegawa et al. | 360/324.12 |
| 2002/0131218 A1* | 9/2002 | Beach | 360/324.12 |
| 2003/0090844 A1* | 5/2003 | Shimizu et al. | 360/324.12 |
| 2005/0007705 A1* | 1/2005 | Dobisz et al. | 360/324.1 |
| 2006/0114620 A1* | 6/2006 | Sbiaa et al. | 360/324.12 |
| 2006/0132990 A1* | 6/2006 | Morise et al. | 360/324.12 |
| 2007/0086121 A1* | 4/2007 | Nagase et al. | 360/324.1 |
| 2008/0031035 A1* | 2/2008 | Rodmacq et al. | 365/171 |
| 2008/0112094 A1* | 5/2008 | Kent et al. | 360/324.11 |

FOREIGN PATENT DOCUMENTS

| | | |
|---|---|---|
| JP | A 11-296833 | 10/1999 |
| JP | A 2001-257395 | 9/2001 |
| JP | A 2006-86508 | 3/2006 |

* cited by examiner

*Primary Examiner* — Daniell L Negron
*Assistant Examiner* — Adam B Dravininkas
(74) *Attorney, Agent, or Firm* — Oliff & Berridge, PLC

(57) ABSTRACT

An MR element includes a pinned layer, a free layer and a nonmagnetic space layer or a tunnel barrier layer sandwiched between the pinned layer and the free layer. A magnetization direction of the free layer is substantially perpendicular to a film surface thereof, and a magnetization direction of the pinned layer is substantially parallel to a film surface thereof.

17 Claims, 9 Drawing Sheets

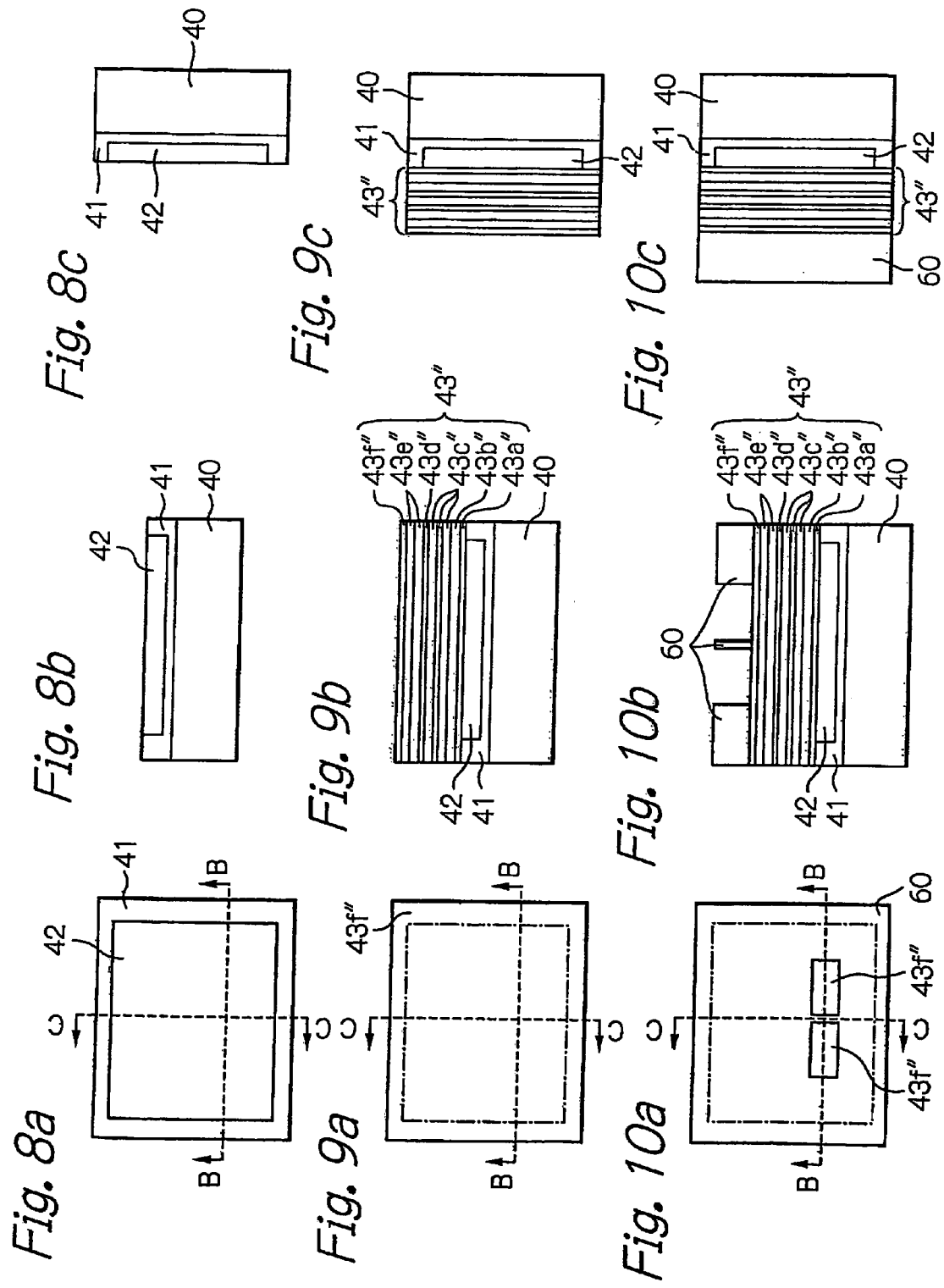

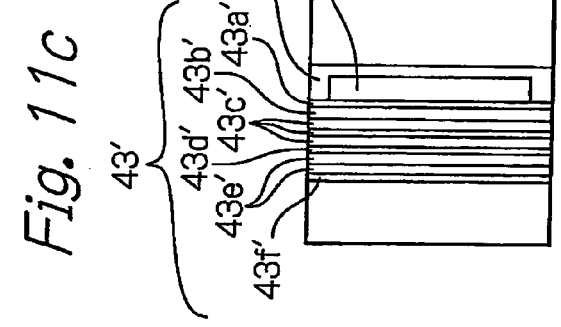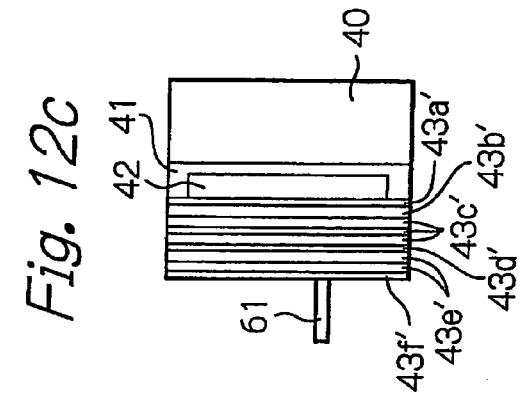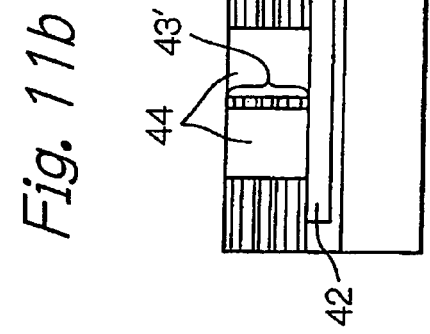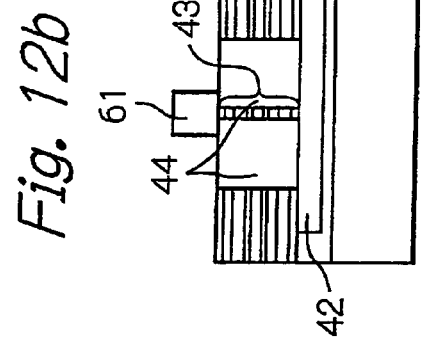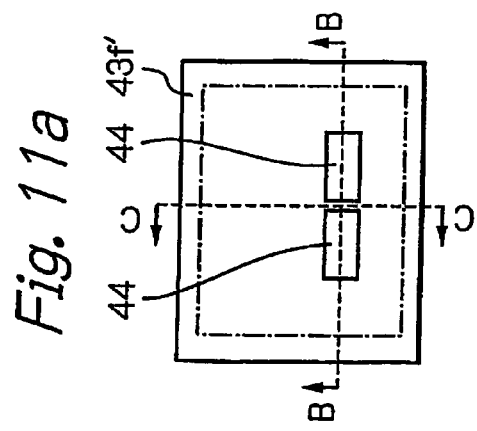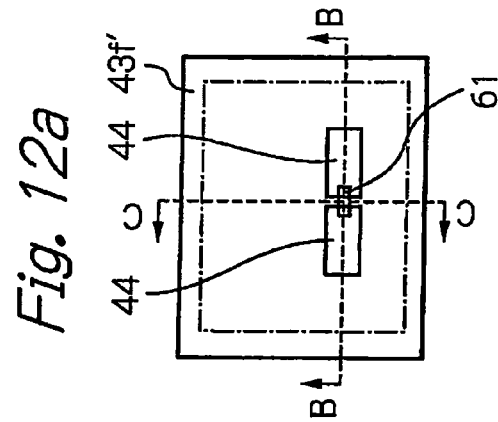

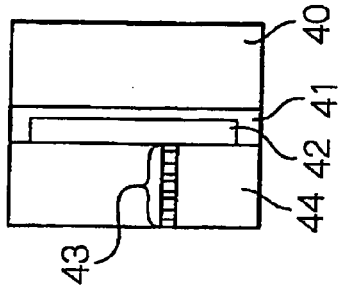
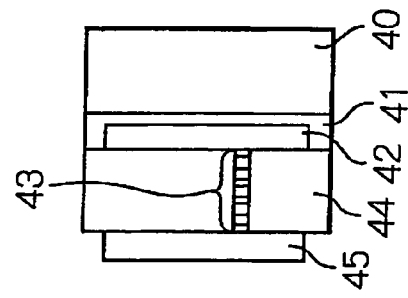
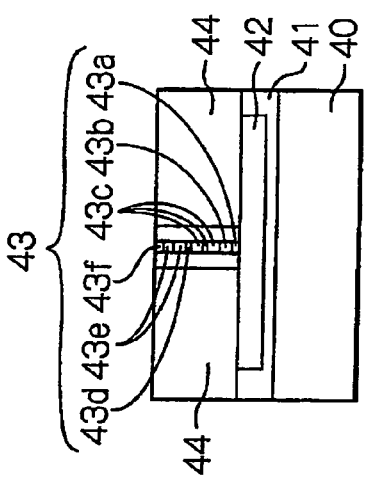
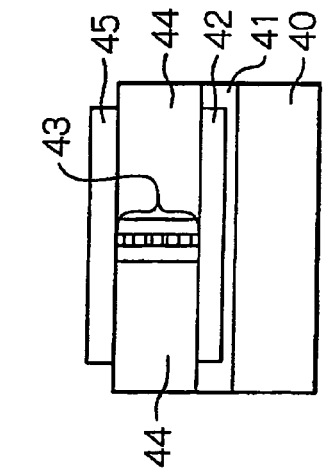
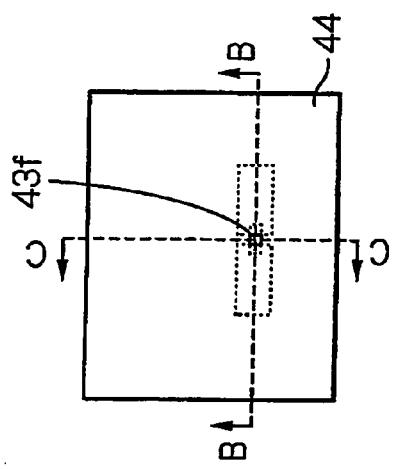
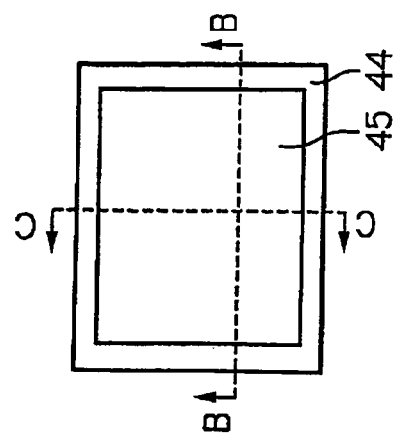

MAGNETORESISTIVE EFFECT ELEMENT AND THIN-FILM MAGNETIC HEAD WITH THE MAGNETORESISTIVE EFFECT ELEMENT

BACKGROUND OF THE INVENTION

1. Field of the Invention

The present invention relates to a magnetoresistive effect (MR) element utilizing a spin-valve effect, and to a thin-film magnetic head with the TMR read head element with the MR element.

2. Description of the Related Art

An MR element utilizing a spin-valve effect has in general an MR multi-layered structure including a pinning layer, a pinned layer, a nonmagnetic space layer and a free layer, or an MR multi-layered structure including a pinning layer, a pinned layer, a tunnel barrier layer and a free layer. An MR element with the former MR multi-layered structure is called as a giant magnetoresistive effect (GMR) element, and an MR element with the latter MR multi-layered structure is called as a tunnel magnetoresistive effect (TMR) element.

In such conventional MR element, magnetization directions of the free layer and the pinned layer are certainly defined in orthogonal directions to each other but in parallel to a film surface together.

According to such conventional configuration of the MR element, since the magnetization direction of the free layer is in parallel to the film surface, instable magnetization regions are consequently produced around the free layer. Thus, when the MR element is miniaturized, a ratio of an area of the instable magnetization regions to an entire element area will greatly increase. Also, according to the conventional configuration, it is necessary to have bias layers for controlling magnetic domains in the free layer at both sides in the track-width directions of the free layer in order to stabilize the magnetization of the free layer.

SUMMARY OF THE INVENTION

It is therefore an object of the present invention to provide a MR element and a thin-film magnetic head with the MR element, whereby a ratio of an area of instable magnetization regions in a free layer to an entire element area can be extremely reduced.

Another object of the present invention is to provide a MR element and a thin-film magnetic head with the MR element, whereby magnetization of a free layer can be stabilized without forming magnetic domain control layers.

According to the present invention, an MR element includes a pinned layer, a free layer and a nonmagnetic space layer or a tunnel barrier layer sandwiched between the pinned layer and the free layer. A magnetization direction of the free layer is substantially perpendicular to a film surface thereof, and a magnetization direction of the pinned layer is substantially parallel to a film surface thereof.

Since the original magnetization direction in the free layer, that is a magnetization direction in the free layer when no external magnetic field is applied thereto, is not parallel to the film surface as the conventional art but substantially perpendicular to the film surface, instable magnetization around both side end sections in the track-width direction of the free layer will never occur, and therefore a higher level output and lower noise of the MR element can be expected. Also, because no bias layer for controlling magnetic domains in the free layer is necessary, configuration of the MR element can be extremely simplified resulting to provide easy fabrication and further miniaturization of the MR element. Furthermore, since the MR element has the spin-valve structure, a high output as well as that in the conventional MR element can be obtained.

It is preferred that the magnetization direction of the pinned layer is substantially parallel to a film surface thereof and parallel to a direction of externally applied magnetic field.

It is also preferred that the free layer includes a perpendicular magnetization film. In this case, the free layer may be a single-layered structure of a perpendicular magnetization film or a multi-layered structure of a perpendicular magnetization film and a soft magnetic film. The perpendicular magnetization film is preferably made of gadolinium iron cobalt (GdFeCo), terbium iron cobalt (TbFeCo), cobalt platinum (CoPt) or iron platinum (FePt). The soft magnetic film is preferably made of cobalt iron (CoFe) or cobalt iron boron (CoFeB).

It is further preferred that the MR element is a TMR element or a GMR element.

According to the present invention, also, a thin-film magnetic head is provided with the MR read head element and an inductive write head element.

It is preferred that the inductive write head element is an inductive write head element with a perpendicular magnetic recording structure.

Other objects and advantages of the present invention will become apparent from the following description of preferred embodiment of the present invention with reference to accompanying drawings.

BRIEF DESCRIPTION OF THE DRAWINGS

FIGS. 8a to 8c are a plane view, a B-B line sectional view and a C-C line sectional view illustrating a part of process in a example for fabricating the TMR read head element part of the thin-film magnetic head in the embodiment according to the present invention;

FIGS. 9a to 9c are a plane view, a B-B line sectional view and a C-C line sectional view illustrating a part of process in the example for fabricating the TMR read head element part of the thin-film magnetic head in the embodiment according to the present invention;

FIGS. 10a to 10c are a plane view, a B-B line sectional view and a C-C line sectional view illustrating a part of process in the example for fabricating the TMR read head element part of the thin-film magnetic head in the embodiment according to the present invention;

FIGS. 11a to 11c are a plane view, a B-B line sectional view and a C-C line sectional view illustrating a part of process in the example for fabricating the TMR read head element part of the thin-film magnetic head in the embodiment according to the present invention;

FIGS. 12a to 12c are a plane view, a B-B line sectional view and a C-C line sectional view illustrating a part of process in the example for fabricating the TMR read head element part of the thin-film magnetic head in the embodiment according to the present invention;

FIGS. 13a to 13c are a plane view, a B-B line sectional view and a C-C line sectional view illustrating a part of process in the example for fabricating the TMR read head element part of the thin-film magnetic head in the embodiment according to the present invention;

FIGS. 14a to 14c are a plane view, a B-B line sectional view and a C-C line sectional view illustrating a part of process in the example for fabricating the TMR read head element part of the thin-film magnetic head in the embodiment according to the present invention.

DESCRIPTION OF THE PREFERRED EMBODIMENT

Figure 1:
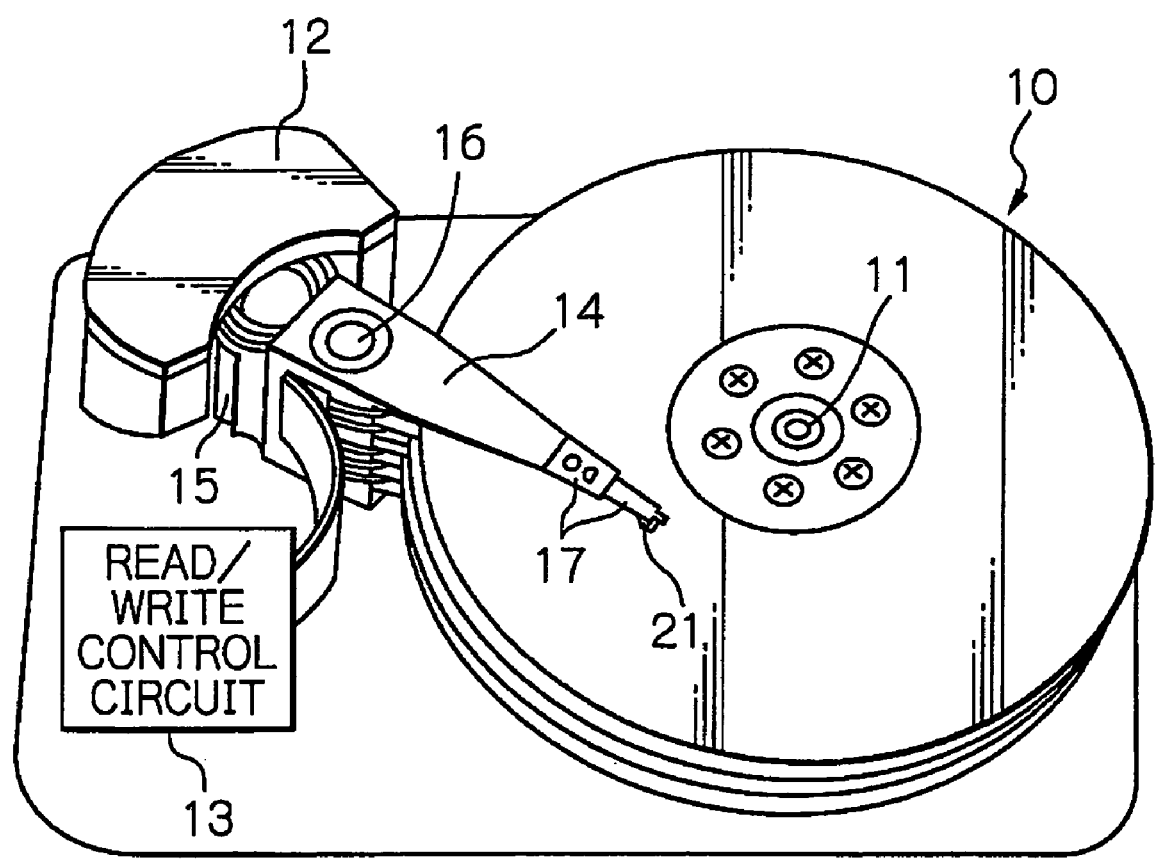
FIG. 1 is a perspective view schematically illustrating a main configuration of a magnetic disk drive apparatus as an embodiment according to the present invention.
Figure 2:
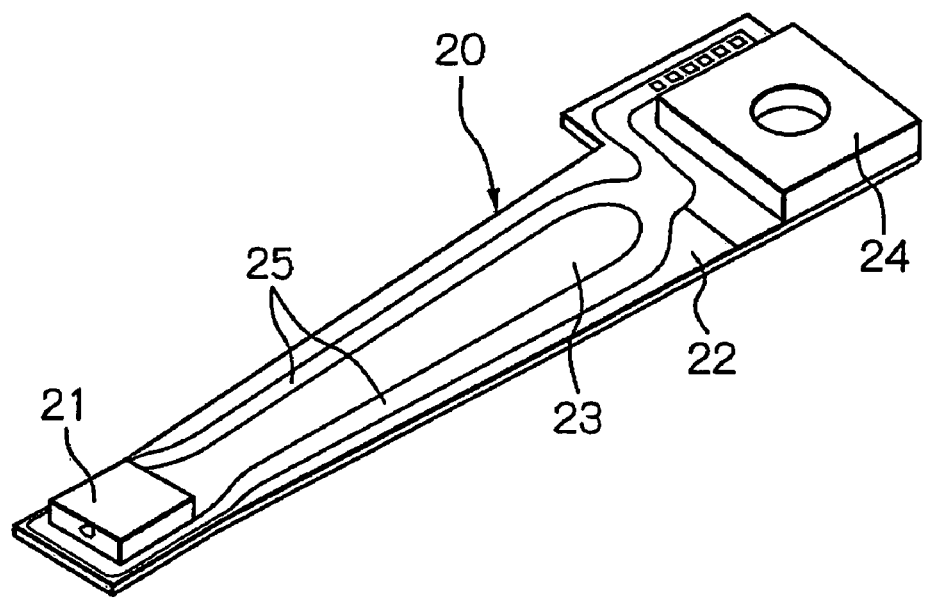
FIG. 2 is a perspective view illustrating an example of the structure of a head gimbal assembly (HGA) shown in FIG. 1.
Figure 3:
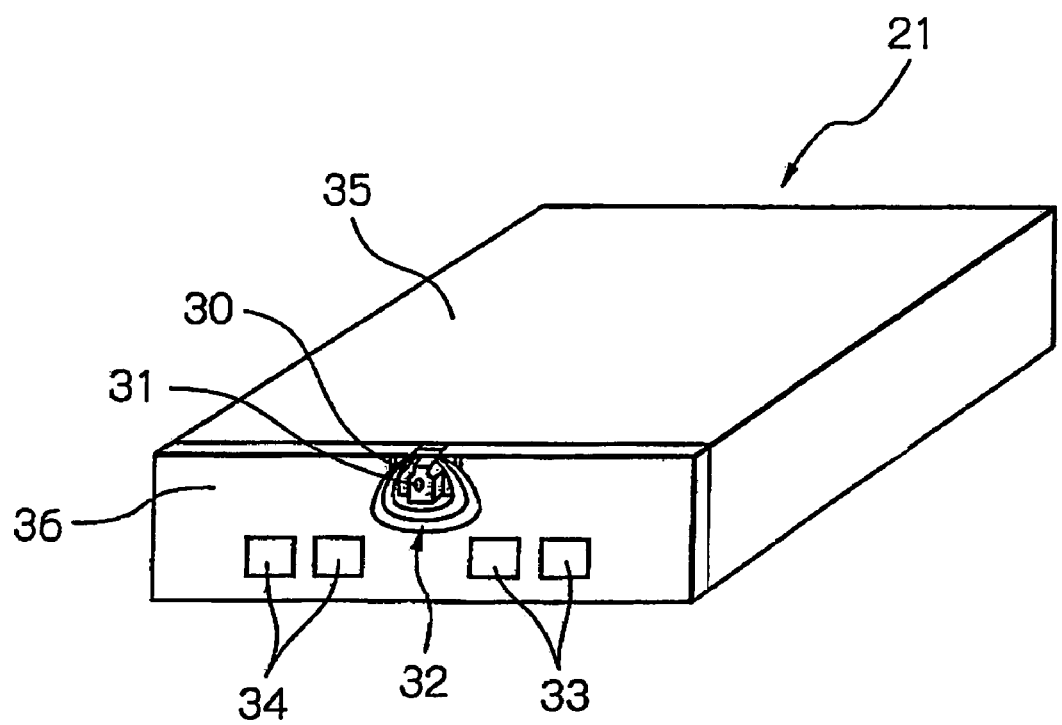
FIG. 3 is a perspective view illustrating a thin-film magnetic head mounted at a top end section of the HGA of FIG. 2.

FIG. 1 schematically illustrates the main structure of a magnetic disk drive apparatus according to an embodiment of the present invention, FIG. 2 illustrates an example of the structure of an HGA of FIG. 1, and FIG. 3 illustrates the thin-film magnetic head mounted at the top end section of the HGA of FIG. 2.

In FIG. 1, a reference numeral 10 denotes a plurality of magnetic disks capable of rotating about a rotary axis of a spindle motor 11, 12 denotes an assembly carriage device for positioning the thin-film magnetic head or magnetic head slider on the track, and 13 denotes a read/write control circuit for controlling read/write operations of the thin-film magnetic head, respectively.

The assembly carriage device 12 includes a plurality of drive arms 14. These drive arms 14 are swingable about a pivot-bearing axis 16 by a voice coil motor (VCM) 15, and stacked in a direction along this axis 16. Each of the drive arms 14 has an HGA 17 mounted at the top end section thereof. The HGA 17 includes a thin-film magnetic head or magnetic head slider 21 facing a surface of each magnetic disk 10. In modifications, the magnetic disk drive apparatus may include only a single magnetic disk 10, a drive arm 14 and an HGA 17.

As shown in FIG. 2, in the HGA, the thin-film magnetic head 21 is fixed onto a top end section of a suspension 20. The thin-film magnetic head 21 has a TMR read head element, an inductive write head element and terminal electrodes electrically connected to an end of a wiring member 25.

The suspension 20 includes mainly a load beam 22, a flexure 23, a base plate 24 and the wiring member 25. The load beam 22 generates a load to be applied to the thin-film magnetic head 21. The flexure 23 having elasticity is fixed onto and supported by the load beam 22. The base plate 24 is arranged on a base of the load beam 22. The wiring member 25 is arranged on the flexure 23 and the load beam 22, and includes trace conductors and connection pads electrically connected to both ends of the trace conductors.

It is obvious that the structure of the suspension according to the present invention is not limited to the above. Although it is not illustrated, a head drive IC chip may be mounted in the middle of the suspension 20.

As shown in FIG. 3, the thin-film magnetic head 21 in this embodiment includes a composite magnetic head element 32 and four signal terminal electrodes 33 and 34, on an element formed surface 36 that is one side surface when an air bearing surface (ABS) 35 of the magnetic head slider serves as the bottom surface. The composite magnetic head element 32 includes a TMR read head element 30 and an inductive write head element 31 that are mutually stacked. The four signal terminal electrodes 33 and 34 are connected to the TMR read head element 30 and the inductive write head element 31. The positions of these terminal electrodes are not limited to those shown in FIG. 3.

Figure 4:
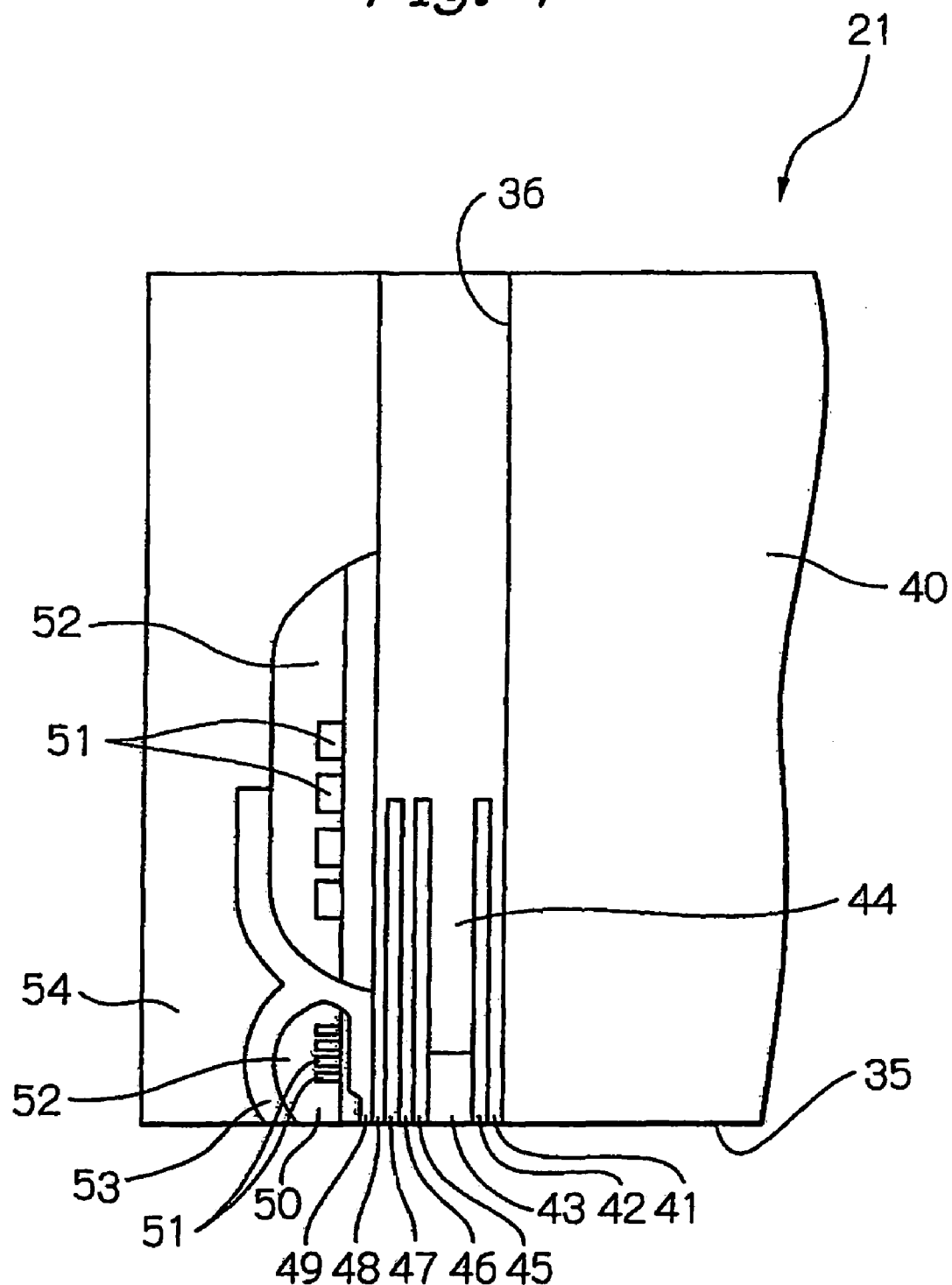
FIG. 4 is a central cross sectional view schematically illustrating the structure of the thin-film magnetic head of FIG. 3.
Figure 5:
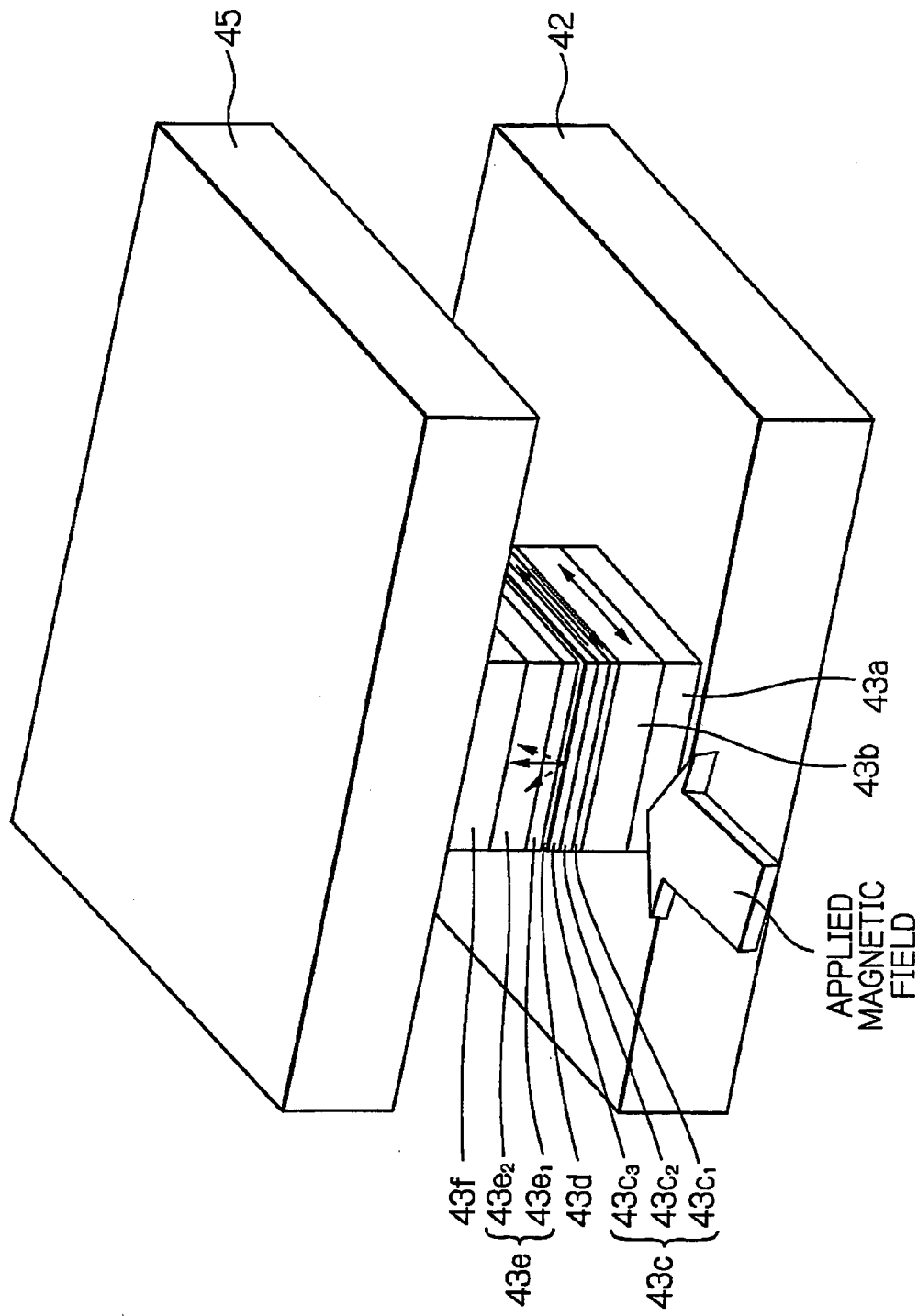
FIG. 5 is a perspective view schematically illustrating the structure of a TMR read head element part of the thin-film magnetic head of FIG. 4.

FIG. 4 schematically illustrates the structure of the thin-film magnetic head in this embodiment, and FIG. 5 schematically illustrates the structure of the TMR read head element part of the thin-film magnetic head. In this embodiment, although the MR read head element consists of a TMR read head element. However, in modifications, it may be formed by a GMR read head element. As is known, the GMR read head element has fundamentally the similar structure as the TMR read head element except for the former has a nonmagnetic conductive layer instead of a tunnel barrier layer.

The ABS 35 facing the surface of the magnetic disk in operation is formed on a slider substrate 40. In operation, the thin-film magnetic head or magnetic head slider 21 hydrodynamically flies above the rotating magnetic disk with a predetermined flying height. An under insulation layer 41 is stacked on the element forming surface 36 of the substrate 40. A lower shield layer 42 also serving as a lower electrode layer is stacked on the under insulation layer 41.

A TMR multi-layer 43 and an insulation layer 44 are stacked on the lower shield layer 42.

The TMR multi-layer 43 has, as will be described in detail later with reference to FIG. 5, a multi-layered structure of a lower metal layer 43a, a pinning layer 43b, a pinned layer 43c, a tunnel barrier layer 43d, a free layer 43e and a cap layer 43f.

An upper shield layer 45 also serving as an upper electrode layer is stacked on the TMR multi-layer 43 and the insulation layer 44.

The TMR read head element is basically composed of the lower shield layer 42, the TMR multi-layer 43, the insulation layer 44 and the upper shield layer 45.

One the upper shield layer 45, an inter-element shield layer 47 sandwiched between insulation layers 46 and 48 is stacked for separating the TMR read head element and an inductive write head element.

As shown in FIG. 4, the inductive write head element is formed on the inter-element shield layer 47 and the insulation layer 48. The inductive write head element includes a main magnetic pole layer 49, an insulation gap layer 50, a write coil layer 51, a write coil insulation layer 52 and an auxiliary magnetic pole layer 53. A protection layer 54 is stacked on the inductive write head element.

It is apparent that various structures other than that shown in FIG. 4 can be adopted as the inductive write head element with a perpendicular magnetic recording structure.

The structure of the TMR read head element part in this embodiment will now be described with reference to FIG. 5.

As aforementioned, the TMR read head element of the thin-film magnetic head is formed by stacking the under insulation layer 41 on the substrate 40, by stacking the lower shield layer 42 also serving as a lower electrode layer on the under insulation layer 41, and by stacking the TMR multi-layer 43 on the lower shield layer 42. The TMR multi-layer 43 has the multi-layered structure formed by stacking in this order from the bottom the lower metal layer 43a made of a nonmagnetic metal material, the pinning layer 43b made of an anti-ferromagnetic material, the pinned layer 43c with a three-layered structure of a ferromagnetic material, a non-magnetic material and a ferromagnetic material, the tunnel barrier layer 43d made of an insulation material, the free layer 43e with a two-layered structure of a soft magnetic material and a ferromagnetic material (perpendicular magnetization film), and the cap layer 43f made of a nonmagnetic metal material.

The substrate 40 is made of a material, such as for example AlTiC, $Al_2O_3$—TiC, and the under insulation layer 41 is made of an insulation material such as alumina ($Al_2O_3$), silicon oxide ($SiO_2$) or the like. The lower shield layer 42 is made of a magnetic metal material such as for example nickel iron (NiFe), CoFe, nickel iron cobalt (NiFeCo), iron aluminum silicon (FeAlSi), iron nitride (FeN), iron zirconium nitride (FeZrN), iron tantalum nitride (FeTaN), cobalt zirconium niobium (CoZrNb), cobalt zirconium tantalum (CoZrTa) or the like.

The lower metal layer 43a has a two-layered structure of a film made of for example tantalum (Ta), chrome (Cr), hafnium (Hf), niobium (Nb), zirconium (Zr), titanium (Ti), molybdenum (Mo), tungsten (W) or the like, and a film made of for example ruthenium (Ru), nickel chrome (NiCr), NiFe, nickel iron chrome (NiFeCr), cobalt (Co), CoFe or the like.

The pinning layer 43b is formed from an anti-ferromagnetic film of for example iridium manganese (IrMn), platinum manganese (PtMn), nickel manganese (NiMn), ruthenium rhodium manganese (RuRhMn) or the like.

The pinned layer 43c in this embodiment is a synthetic type with a three-layered structure of a first ferromagnetic film $43c_1$, a nonmagnetic film $43c_2$ and a second ferromagnetic film $43c_3$ sequentially stacked in this order. Namely, the pinned layer 43c has the first ferromagnetic film $43c_1$ made of for example CoFe or the like, the nonmagnetic film $43c_2$ made of for example an alloy including one or at least two of Ru, rhodium (Rh), iridium (Ir), Cr, rhenium (Re), Cu or the like, and the second ferromagnetic film $43c_3$ made of for example CoFe, CoFeB or the like, stacked in this order from the bottom. In modifications, the pinned layer 43c may be formed from a single layer structure of a ferromagnetic material.

The tunnel barrier layer 43d is made of oxide of aluminum (Al), Ti, Ta, Zr, Hf, magnesium (Mg), silicon (Si), zinc (Zn) or the like.

The free layer 43e has a two-layered structure of a soft magnetic film $43e_1$ made of for example CoFe, CoFeB or the like to improve an MR ratio, and a perpendicular magnetization film $43e_2$ made of for example GdFeCo, TbFeCo, CoPt, FePt or the like. In modifications, the free layer 43e may be formed from a single layer structure of a perpendicular magnetization film made of for example GdFeCo, TbFeCo, CoPt, FePt or the like.

The cap layer 43f has a single layer structure or a multi-layered structure of a nonmagnetic conductive material such as for example Ta, Ru, Hf, Nb, Zr, Ti, Cr, W or the like.

On the TMR multi-layer 43 and the insulation layer 44, the upper shield layer 5 is stacked. The upper shield layer 45 operates as an upper electrode for feeding current to the TMR multi-layer 43 and is made of a magnetic metal material such as for example NiFe, CoFe, FeNiCo, FeAlSi, FeN, FeZrN, FeTaN, CoZrNb, CoZrTa or the like.

Figure 6:
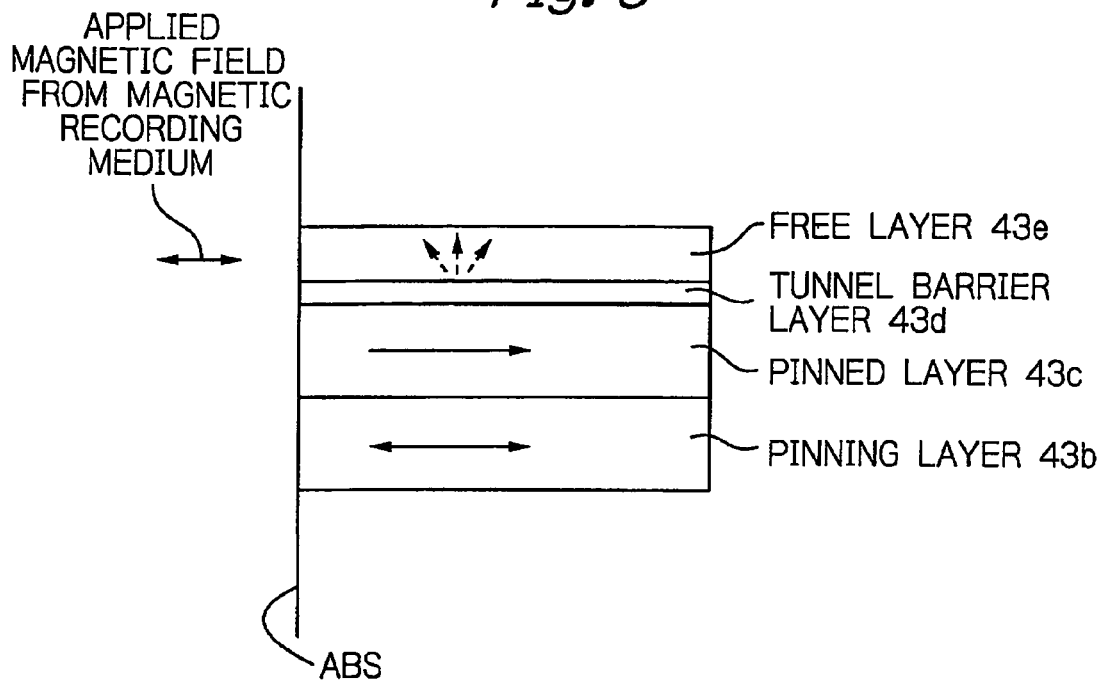
FIG. 6 is a central cross sectional view for illustrating a fundamental principal of the present invention.
Figure 7:
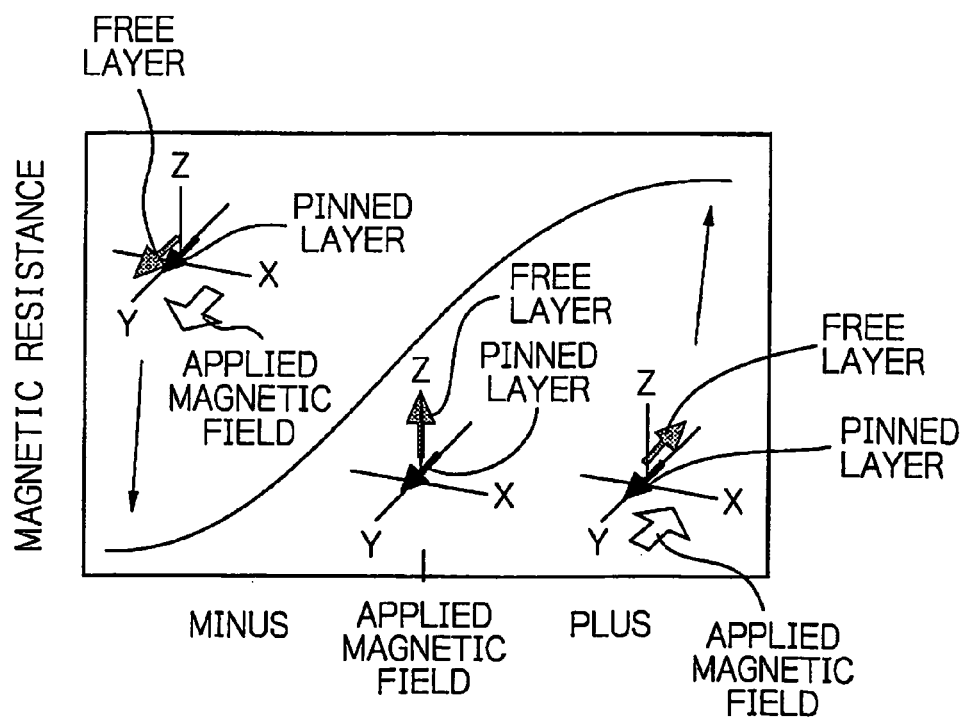
FIG. 7 is a view representing magnetic resistance characteristics with respect to applied magnetic field from a recording medium, for illustrating a fundamental principal of the present invention.

FIG. 6 illustrates a fundamental principal of the present invention, and FIG. 7 represents magnetic resistance characteristics with respect to applied magnetic field from a recording medium, for illustrating the fundamental principal of the present invention.

In the present invention, since a perpendicular magnetization layer is used in the free layer 43e, in other words, the free layer 43e is configured with a two-layered structure of a soft magnetic layer $43e_1$ and a perpendicular magnetization layer $43e_2$, or with a single layer structure of only a perpendicular magnetization layer, the magnetization direction of the free layer 43e is substantially perpendicular to the film surface of the TMR multi-layer 43 whereas the magnetization direction of the pinned layer 43c is substantially parallel to the film' surface of the TMR multi-layer 43. Therefore, as shown in FIG. 6, when a magnetic field is applied to the TMR multi-layer 43 in a direction perpendicular to the ABS from a perpendicular magnetic recording medium not shown, the magnetization in the free layer 43e changes as shown by a broken line arrow shown in this figure. This phenomenon is more clearly shown in FIG. 7. That is, when no magnetic field is applied from the recording medium, the magnetization in the free layer 43e directs to a direction perpendicular to the film surface or to a Z-direction. When a magnetic field directed to the minus direction (corresponding to a plus Y-direction) is applied, the magnetization in the free layer 43e leans from the Z-direction to a direction parallel to the film surface or to a plus Y-direction. Whereas when a magnetic field directed to the plus direction (corresponding to a minus Y-direction) is applied, the magnetization in the free layer 43e leans from the Z-direction to a direction parallel to the film surface or to a minus Y-direction.

As aforementioned, according to the present invention, since the original magnetization direction in the free layer 43e, that is a magnetization direction in the free layer 43e when no external magnetic field is applied thereto, is not parallel to the film surface as the conventional art but substantially perpendicular to the film surface, instable magnetization around both side end sections in the track-width direction of the free layer will never occur, and therefore a higher level output and lower noise of the TMR element can be expected. Also, because no bias layer for controlling magnetic domains in the free layer 43e is necessary, configuration of the TMR element can be extremely simplified resulting to provide easy fabrication and further miniaturization of the TMR element. Furthermore, since the TMR element has the spin-valve structure, a high output as well as that in the conventional TMR element can be obtained.

FIGS. 8a to 8c, FIGS. 9a to 9c, FIGS. 10a to 10c, FIGS. 11a to 11c, FIGS. 12a to 12c, FIGS. 13a to 13c, and FIGS. 14a to 14c illustrate parts of process in a example for fabricating the TMR read head element in the embodiment. Hereinafter, with reference to these figures, a wafer fabrication process of the thin-film magnetic head will be described.

As shown in FIGS. 8a to 8c, first, the lower shield layer 42 is formed on the under insulation layer 41 formed on the substrate 40 made of a conductive material such as AlTiC. This lower shield layer 42 is formed by for example a frame plating method a magnetic metal material such as for example NiFe, CoFe, FeNiCo, FeAlSi, FeN, FeZrN, FeTaN, CoZrNb, CoZrTa or the like to have a thickness of about 100 to 3000 nm.

Then, as shown in FIGS. 9a to 9c, a TMR multi-layer 43" is deposited thereon. The TMR multi-layer 43" has films for the lower metal layer 43a", a film for the pinning layer 43b", films for the pinned layer 43c", a film for the tunnel barrier layer 43d", films for the free layer 43e" and a film for the cap layer 43f" sequentially laminated each other.

The films for the lower metal layer 43a" are formed by depositing, using a sputtering method, a film of for example Ta, Cr, Hf, Nb, Zr, Ti, Mo, W or the like with a thickness of about 0.5 to 5 nm, and a film of for example Ru, NiCr, NiFe, NiFeCr, Co, CoFe or the like with a thickness of about 1 to 6 nm.

The film for the pinning layer 43b" is formed by depositing, using a sputtering method, an anti-ferromagnetic film of for example IrMn, PtMn, NiMn, RuRhMn or the like with a thickness of about 5 to 30 nm.

The films for the pinned layer 43c" are formed by sequentially depositing, using a sputtering method, a first ferromagnetic film of for example CoFe or the like with a thickness of about 1 to 5 nm, a nonmagnetic film of for example an alloy including one or at least two of Ru, Rh, Ir, Cr, Re, Cu or the like with a thickness of about 0.8 nm, and a second ferromagnetic film of for example CoFe, CoFeSi, CoMnGe, CoMnSi, CoMnAl or the like with a thickness of about 1 to 3 nm.

The film for the tunnel barrier layer 43d" is made of an oxide including Al, Ti, Ta, Zr, Hf, Mg, Si, Zn or the like with a thickness of about 0.5 to 1 nm.

The films for the free layer 43e" are formed by sequentially depositing, using a sputtering method, a soft magnetic film of for example CoFe, CoFeB or the like with a thickness of about 1 to 9 nm and a perpendicular magnetization film of for example GdFeCo, TbFeCo, CoPt, FePt or the like with a thickness of about 3 nm.

The film for the cap layer 43f is formed by depositing, using a sputtering method, to have a single layer structure or a two or more layers structure of nonmagnetic conductive material of for example Ta, Ru, Hf, Nb, Zr, Ti, Cr, W or the like with a thickness of about 1 to 10 nm.

Then, as shown in FIGS. 10a to 10c, a photo-resist pattern 60 used in patterning of the TMR multi-layer 43" for defining a track width is formed thereon.

Then, the TMR multi-layer 43" is patterned by milling with ion beam that will travel in straight lines such as IBE, RIE or the like using the photo-resist pattern 60 as a mask for defining a track width, so as to obtain a lower shield layer 42a and a TMR multi-layer 43' consisting of films for the lower metal layer 43a', a film for the pinning layer 43b', films for the pinned layer 43c', a film for the tunnel barrier layer 43d', films for the free layer 43e' and a film for the cap layer 43f'. Then, a film for an insulation layer 44 is deposited thereon. The film for an insulation layer 44 is formed from an insulation material such as $Al_2O_3$ or $SiO_2$ deposited by a sputtering method, an IBD method, a CVD method or the like to have a thickness of about 60 nm. Then, the photo-resist pattern 60 is removed, namely the lift-off process is performed. FIGS. 11a to 11c show this state.

Thereafter, as shown in FIGS. 12a to 12c, a photo-resist pattern 61 used in patterning of the TMR multi-layer 43' for defining a length perpendicular to the track width (length along the MR height) is formed thereon.

Then, the TMR multi-layer 43' is patterned by milling with ion beam that will travel in straight lines such as IBE, RIE or the like using the photo-resist pattern 61 as a mask for defining a length perpendicular to the track width (length along the MR height), so as to obtain a TMR multi-layered structure 43 consisting of the lower metal layer 43a, the pinning layer 43b, the pinned layer 43c, the tunnel barrier layer 43d, the free layer 43e and the cap layer 43f. Then, a film for an insulation layer 44 is deposited thereon. The film for an insulation layer 44 is formed from an insulation material such as $Al_2O_3$ or $SiO_2$ deposited by a sputtering method, an IBD method, a CVD method or the like to have substantially the same thickness as that of the TMR multi-layer 43'. Then, the photo-resist pattern 61 is removed, namely the lift-off process is performed. FIGS. 13a to 13c show this state.

Thereafter, the upper shield layer 45 is deposited thereon as shown in FIGS. 14a to 14c. The upper shield layer 45 is formed by depositing a magnetic metal material such as for example NiFe, CoFe, FeNiCo, FeAlSi, FeN, FeZrN, FeTaN, CoZrNb, CoZrTa or the like, using a frame plating method for example, to have a thickness of about 100 to 3000 nm.

Typically, write head elements are fabricated on thus formed read head elements to complete a thin-film magnetic head wafer.

Figure 15A:
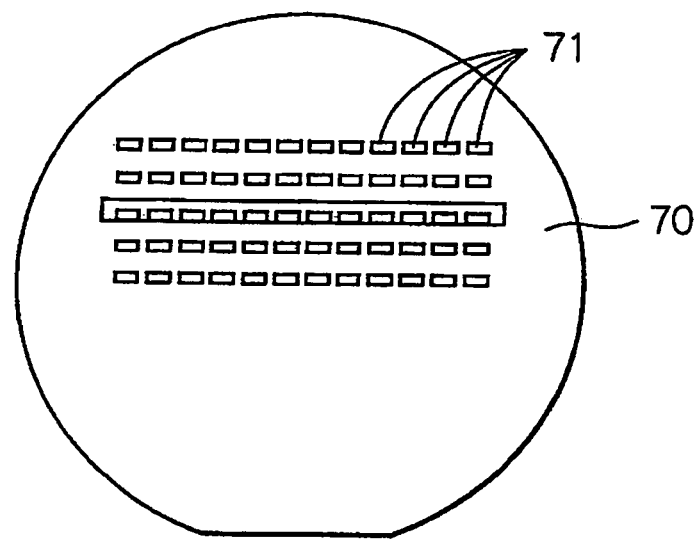
FIGS. 15a to 15c are a plane view, a B-B line sectional view and a C-C line sectional view illustrating a part of process in the example for fabricating the TMR read head element part of the thin-film magnetic head in the embodiment according to the present invention.
Figure 15B:
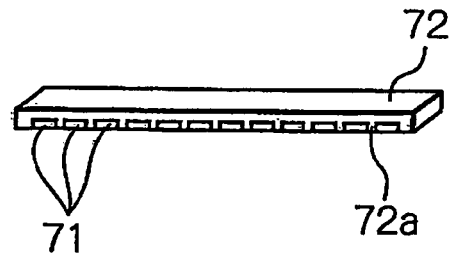
Figure 15C:
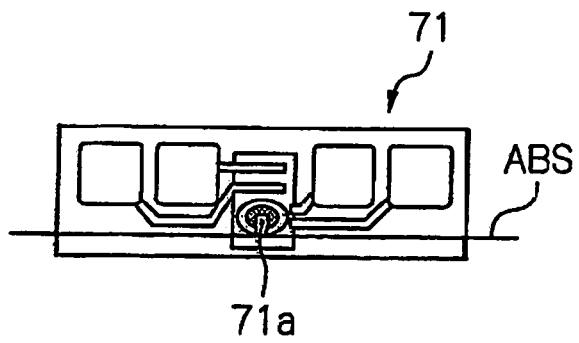

After the above-mentioned wafer process, a plurality of bars are obtained from the fabricated thin-film magnetic head wafer and MR height of each bar is adjusted. FIGS. 15a to 15c illustrate a part of this process for obtaining bars and for adjusting the MR height of each bar.

As shown in FIG. 15a, in the wafer process, many of thin-film magnetic heads are formed to arrange in matrix on an integration surface of the thin-film magnetic head wafer 70. The wafer 70 is then cut into a plurality of bars 72 so that each bar has a plurality of thin-film magnetic heads 71 aligned with each other as shown in FIG. 15b. Then, an ABS side surface 72a of each bar 73 is lapped to adjust the MR height. This MR-height adjustment is executed until a magnetic head element section 71a of each thin-film magnetic head 71 exposes at the ABS as shown in FIG. 15c. Thereafter, the bar 73 is cut to obtain individually separated thin-film magnetic heads.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A magnetoresistive effect element comprising:
a substrate;
a pinned layer;
a free layer; and
a nonmagnetic space layer or a tunnel barrier layer sandwiched between said pinned layer and said free layer, wherein
said pinned layer, said free layer, and said nonmagnetic space layer or said tunnel barrier layer are stacked on said substrate, and
a magnetization direction of said free layer is substantially perpendicular to a film surface thereof that is parallel to said substrate when no magnetic field is externally applied to said free layer, and a magnetization direction of said pinned layer is substantially parallel to a film surface thereof that is parallel to said substrate.

2. The magnetoresistive effect element as claimed in claim 1, wherein the magnetization direction of said pinned layer is substantially parallel to the film surface thereof that is parallel to said substrate and parallel to a direction of externally applied magnetic field.

3. The magnetoresistive effect element as claimed in claim 1, wherein said free layer comprises a perpendicular magnetization film.

4. The magnetoresistive effect element as claimed in claim 3, wherein said free layer comprises a single-layered structure of a perpendicular magnetization film.

5. The magnetoresistive effect element as claimed in claim 3, wherein said free layer comprises a multi-layered structure of a perpendicular magnetization film and a soft magnetic film.

6. The magnetoresistive effect element as claimed in claim 5, wherein said soft magnetic film is made of cobalt iron or cobalt iron boron.

7. The magnetoresistive effect element as claimed in claim 3, wherein said perpendicular magnetization film is made of gadolinium iron cobalt, terbium iron cobalt, cobalt platinum or iron platinum.

8. The magnetoresistive effect element as claimed in claim 1, wherein said magnetoresistive effect element is a tunnel magnetoresistive effect element or a giant magnetoresistive effect element.

9. A thin-film magnetic head provided with a magnetoresistive effect read head element and an inductive write head element, said magnetoresistive effect element comprises:
    a substrate;
    a pinned layer;
    a free layer; and
    a nonmagnetic space layer or a tunnel barrier layer sandwiched between said pinned layer and said free layer, wherein
    said pinned layer, said free layer, and said nonmagnetic space layer or said tunnel barrier layer are stacked on said substrate, and
    a magnetization direction of said free layer is substantially perpendicular to a film surface thereof that is parallel to said substrate when no magnetic field is externally applied to said free layer, and a magnetization direction of said pinned layer is substantially parallel to a film surface thereof that is parallel to said substrate.

10. The thin-film magnetic head as claimed in claim 9, wherein the magnetization direction of said pinned layer is substantially parallel to the film surface thereof that is parallel to said substrate and parallel to a direction of an externally applied magnetic field.

11. The thin-film magnetic head as claimed in claim 9, wherein said free layer comprises a perpendicular magnetization film.

12. The thin-film magnetic head as claimed in claim 11, wherein said free layer comprises a single-layered structure of a perpendicular magnetization film.

13. The thin-film magnetic head as claimed in claim 11, wherein said free layer comprises a multi-layered structure of a perpendicular magnetization film and a soft magnetic film.

14. The thin-film magnetic head as claimed in claim 13, wherein said soft magnetic film is made of cobalt iron or cobalt iron boron.

15. The thin-film magnetic head as claimed in claim 11, wherein said perpendicular magnetization film is made of gadolinium iron cobalt, terbium iron cobalt, cobalt platinum or iron platinum.

16. The thin-film magnetic head as claimed in claim 9, wherein said magnetoresistive effect element is a tunnel magnetoresistive effect element or a giant magnetoresistive effect element.

17. The thin-film magnetic head as claimed in claim 9, wherein said inductive write head element is an inductive write head element with a perpendicular magnetic recording structure.

* * * * *